(12) United States Patent
Wisotzki et al.

(10) Patent No.: US 10,685,938 B2
(45) Date of Patent: Jun. 16, 2020

(54) DIE STACK ASSEMBLY USING AN EDGE SEPARATION STRUCTURE FOR CONNECTIVITY THROUGH A DIE OF THE STACK

(71) Applicant: Littelfuse, Inc., Chicago, IL (US)

(72) Inventors: Elmar Wisotzki, Darmstadt (DE);
Frank Ettingshausen, Darmstadt (DE)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 15/619,516

(22) Filed: Jun. 11, 2017

(65) Prior Publication Data

US 2017/0278828 A1 Sep. 28, 2017

Related U.S. Application Data

(63) Continuation of application No. 15/056,818, filed on Feb. 29, 2016, now Pat. No. 9,704,832.

(51) Int. Cl.
*H01L 21/78* (2006.01)
*H01L 23/31* (2006.01)
(Continued)

(52) U.S. Cl.
CPC ............ *H01L 25/074* (2013.01); *H01L 21/78* (2013.01); *H01L 23/3171* (2013.01); *H01L 23/49838* (2013.01); *H01L 23/585* (2013.01); *H01L 24/06* (2013.01); *H01L 24/32* (2013.01); *H01L 24/33* (2013.01); *H01L 24/73* (2013.01);
(Continued)

(58) Field of Classification Search
CPC ....... H01L 29/74; H01L 29/749; H01L 29/70;
H01L 29/66363; H01L 29/66401; H01L 29/7424; H01L 29/0817; H01L 27/04; H01L 27/10; H01L 27/1027; H01L 24/32; H01L 25/074; H01L 29/0615; H01L 24/94; H01L 24/73; H01L 24/83; H01L 24/03;
(Continued)

(56) References Cited

U.S. PATENT DOCUMENTS 4,040,878 A    8/1977  Rowe ............................ 148/188
4,351,677 A    9/1982  Mochizuki et al. .......... 148/188
(Continued)

FOREIGN PATENT DOCUMENTS

DE    102011115886    10/2011
DE    102011115887    10/2011
DE    102013003527     3/2013

*Primary Examiner* — Marcos D. Pizarro
*Assistant Examiner* — Antonio B Crite

(57) ABSTRACT

A die stack assembly includes first and second power semiconductor device dice. The first die has a P type peripheral edge separation structure that extends from the top planar semiconductor surface of the first die all the way to the bottom planar semiconductor surface of the die, and that is doped at least in part with aluminum. The backside of the first die is mounted to the backside of the second die. A metal feature that is not covered with passivation, and that can serve as a bonding pad, is disposed on part of the peripheral edge separation structure. A metal member (for example, a bond wire or metal clip) contacts the metal feature such that an electrical connection is established from the metal member, through the metal feature, through the peripheral edge separation structure of the first die, and to an electrode of the second die.

18 Claims, 4 Drawing Sheets

STACKED POWER DEVICE ASSEMBLY

(51) Int. Cl.
*H01L 23/498* (2006.01)
*H01L 23/58* (2006.01)
*H01L 23/00* (2006.01)
*H01L 29/06* (2006.01)
*H01L 29/08* (2006.01)
*H01L 29/167* (2006.01)
*H01L 29/417* (2006.01)
*H01L 29/74* (2006.01)
*H01L 25/07* (2006.01)
*H01L 25/00* (2006.01)

(52) U.S. Cl.
CPC .............. *H01L 24/83* (2013.01); *H01L 24/85* (2013.01); *H01L 24/92* (2013.01); *H01L 24/94* (2013.01); *H01L 25/50* (2013.01); *H01L 29/0615* (2013.01); *H01L 29/0646* (2013.01); *H01L 29/0649* (2013.01); *H01L 29/0834* (2013.01); *H01L 29/167* (2013.01); *H01L 29/41716* (2013.01); *H01L 29/74* (2013.01); *H01L 24/05* (2013.01); *H01L 24/11* (2013.01); *H01L 24/13* (2013.01); *H01L 24/16* (2013.01); *H01L 24/27* (2013.01); *H01L 24/29* (2013.01); *H01L 24/40* (2013.01); *H01L 24/41* (2013.01); *H01L 24/45* (2013.01); *H01L 24/48* (2013.01); *H01L 24/49* (2013.01); *H01L 24/81* (2013.01); *H01L 24/84* (2013.01); *H01L 2224/0401* (2013.01); *H01L 2224/04026* (2013.01); *H01L 2224/04034* (2013.01); *H01L 2224/04042* (2013.01); *H01L 2224/056* (2013.01); *H01L 2224/05552* (2013.01); *H01L 2224/05554* (2013.01); *H01L 2224/0603* (2013.01); *H01L 2224/06181* (2013.01); *H01L 2224/11334* (2013.01); *H01L 2224/13339* (2013.01); *H01L 2224/16227* (2013.01); *H01L 2224/16238* (2013.01); *H01L 2224/27334* (2013.01); *H01L 2224/2919* (2013.01); *H01L 2224/29139* (2013.01); *H01L 2224/29339* (2013.01); *H01L 2224/32145* (2013.01); *H01L 2224/32225* (2013.01); *H01L 2224/32227* (2013.01); *H01L 2224/32238* (2013.01); *H01L 2224/3303* (2013.01); *H01L 2224/33051* (2013.01); *H01L 2224/33181* (2013.01); *H01L 2224/40091* (2013.01); *H01L 2224/40227* (2013.01); *H01L 2224/41112* (2013.01); *H01L 2224/45014* (2013.01); *H01L 2224/45015* (2013.01); *H01L 2224/48091* (2013.01); *H01L 2224/48227* (2013.01); *H01L 2224/48472* (2013.01); *H01L 2224/49112* (2013.01); *H01L 2224/73203* (2013.01); *H01L 2224/73253* (2013.01); *H01L 2224/73263* (2013.01); *H01L 2224/73265* (2013.01); *H01L 2224/8184* (2013.01); *H01L 2224/81191* (2013.01); *H01L 2224/81203* (2013.01); *H01L 2224/8384* (2013.01); *H01L 2224/83101* (2013.01); *H01L 2224/83191* (2013.01); *H01L 2224/83203* (2013.01); *H01L 2224/84447* (2013.01); *H01L 2224/85447* (2013.01); *H01L 2224/92* (2013.01); *H01L 2224/92242* (2013.01); *H01L 2224/92246* (2013.01); *H01L 2224/92247* (2013.01); *H01L 2224/94* (2013.01); *H01L 2924/00014* (2013.01); *H01L 2924/1301* (2013.01); *H01L 2924/13055* (2013.01); *H01L 2924/19107* (2013.01)

(58) Field of Classification Search
CPC ........... H01L 29/0834; H01L 29/41716; H01L 24/92
USPC .......... 257/E27.064, E27.006, E27.013, 107, 257/110, 120, 133, 134, 140
See application file for complete search history.

(56) References Cited

U.S. PATENT DOCUMENTS

| | | | | |
|---|---|---|---|---|
| 4,779,126 A | | 10/1988 | Herman | 257/113 |
| 4,904,609 A | | 2/1990 | Temple | 437/6 |
| 5,608,237 A | * | 3/1997 | Aizawa | H01L 29/7395 257/119 |
| 5,698,454 A | | 12/1997 | Zommer | 437/6 |
| 6,194,290 B1 | * | 2/2001 | Kub | H01L 21/187 257/E21.054 |
| 6,936,908 B2 | | 8/2005 | Kelberlau et al. | 257/502 |
| 7,030,426 B2 | | 4/2006 | Neidig | 257/170 |
| 7,442,630 B2 | | 10/2008 | Kelberlau et al. | 438/510 |
| 7,776,672 B2 | | 8/2010 | Nakazawa et al. | 438/197 |
| 8,093,652 B2 | | 1/2012 | Veeramma et al. | 257/329 |
| 8,647,974 B2 | | 2/2014 | Topacio et al. | 257/766 |
| 2003/0228848 A1 | * | 12/2003 | Escoffier | H01L 27/0251 455/91 |
| 2011/0193133 A1 | | 8/2011 | Ogura | 257/184 |
| 2014/0246761 A1 | | 9/2014 | Veeramma | 257/653 |
| 2014/0246790 A1 | | 9/2014 | Haney et al. | 257/782 |
| 2016/0148819 A1 | * | 5/2016 | Heuck | H01L 21/4825 438/121 |
| 2017/0012031 A1 | * | 1/2017 | Lim | H01L 25/18 |

* cited by examiner

STACKED POWER DEVICE ASSEMBLY

STACKED POWER DEVICE ASSEMBLY

PERIPHERAL EDGE SEPARATION TRENCH
AND DIFFUSION STRUCTURE

STACKED POWER DEVICE ASSEMBLY

DIE STACK ASSEMBLY USING AN EDGE SEPARATION STRUCTURE FOR CONNECTIVITY THROUGH A DIE OF THE STACK

CROSS REFERENCE TO RELATED APPLICATIONS

This application is a continuation of, and claims priority under 35 U.S.C. § 120 from, nonprovisional U.S. patent application Ser. No. 15/056,818 entitled "Die Stack Assembly Using An Edge Separation Structure For Connectivity Through A Die Of The Stack," filed on Feb. 29, 2016, now U.S. Pat. No. 9,704,832, the subject matter of which is incorporated herein by reference.

TECHNICAL FIELD

The described embodiments relate to power semiconductor devices, and more particularly to power semiconductor device dice that have peripheral edge separation structures that are at least in part doped with aluminum.

SUMMARY

In a first novel aspect, a die stack assembly comprises a first power semiconductor device die and a second power semiconductor device die. The backside of the first power semiconductor device die is mounted to the backside of the second power semiconductor device die. The first power semiconductor device die has a peripheral edge separation structure that extends all the way from a first substantially planar semiconductor surface of the first die to a second substantially planar semiconductor surface of the first die along a side edge of the first die. The peripheral edge separation structure is a P type region that is at least in part doped with aluminum. A surface area of the peripheral edge separation structure of the first die is covered with a metal feature. There is passivation on the first die, but the passivation does not entirely cover the metal feature. The metal feature is covered, formed and sized so that it can serve as a wire bond pad or a landing pad. A metal member (for example, a bond wire or a metal lead of a leadframe or a bond ball or a metal clip) is attached to this unpassivated metal feature such that an electrical connection is established from the metal member, through the metal feature, through the peripheral edge separation structure, through a metal electrode on the backside of the first die, and to an electrode of the second die. The metal feature on the first die is, in some examples, disposed on a top surface of the overall die stack assembly. The metal feature of the first die is, in other examples, disposed on the bottom of the overall die stack assembly. The second power semiconductor die may have, or may not have, a peripheral edge separation structure that is at least in part doped with aluminum.

In a second novel aspect, a die-sized interface member is attached to the second power semiconductor device die of the die stack assembly. The first die, the second die, and the die-sized interface member are all cut at the same time as a single larger die from a bonded wafer structure. The first die has a side edge periphery that defines a rectangular planar area bounded on four sides by the side edge periphery of the first die. The second die has a side edge periphery that defines a rectangular planar area bounded on four sides by the side edge periphery of the second die. The die-sized interface member has a side edge periphery that defines a rectangular planar area bounded on four sides by the side edge periphery of the die-sized interface member. These rectangular planar areas of the first die, the second die, and the die-sized interface member are all of the same size and shape. The die-sized interface member includes an insulative layer and a plurality of metal portions. The insulative layer may, for example, be a flexible substrate insulative layer of one or more mylar or polyimide layers. The die-sized interface member may be a square flex circuit or a square flexible printed circuit board. A passivation layer on the downward facing surface of the second die is substantially thicker than metal features on the downward facing surface of the second die. The upward facing metal portions of the die-sized interface member extend upward from the plane of the top surface of insulative layer of the die-sized interface member by enough so that a first of the metal portions of the die-sized interface member makes electrical contact with a first metal feature on the bottom of the second die (for example, through an intervening first layer of sintered silver), and so that a second of the metal portions of the die-sized interface member extends upward from the plane of the top surface of the insulative layer of the die-sized interface member so that the second metal portion makes electrical contact with a second metal feature on the bottom of the second die (for example, through an intervening second layer of sintered silver). The two upward facing metal portions of the die-sized interface member have enough offset distance to extend through the thickness of the passivation and to reach the silver or other metal features on the bottom side of the second die. The resulting overall assembly (first die, second die, and die-sized interface member) is then mounted down onto a substrate. Metal portions that extend downward from the bottom of the die-sized interface member register with, and make electrical contact with, corresponding patterned metal features on the top of the substrate. Each metal portion of the die-sized interface member provides an electrical connection from a metal feature on the bottom of the second die to a corresponding patterned metal feature on the top of the substrate. In one example, the substrate includes a rigid insulative layer and multiple patterned metal features disposed on the insulative layer. The rigid insulative layer may, for example, be a ceramic substrate layer or an FR4 type fiberglass/epoxy substrate layer. The substrate may be a DBM (Direct Bonded Metal) structure. The resulting power semiconductor die stack structure on the substrate is then mounted to a leadframe. Metal features on the top of the die stack are wire bonded to the substrate and/or to landing pads of the leadframe. Also, various ones of the patterned metal features of the substrate are wirebonded to landing pads of the leadframe as appropriate. A semiconductor package is then formed around and over the assembly. The semiconductor package in one example is formed by overmolding the substrate and the multi-die stack with a volume of encapsulant in an injection molding process. The metal leads of the lead frame that extend from the volume of encapsulant are then trimmed and lead formed to make a standard leaded plastic semiconductor device package. Within the package, the peripheral edge separation structure of one power semiconductor device die of the die stack is used to make electrical connection through that die and to an electrode of the other power semiconductor device die of the die stack.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to background examples and some embodiments of the invention, examples of which are illustrated in the accompanying drawings. In the description and claims below, when a first object is referred to as being disposed "over" or "on" or "covering" a second object, it is to be understood that the first object can be directly on the second object, or an intervening object may be present between the first and second objects. Similarly, terms such as "top", "bottom", "side", "up", "upward", "down", "downward", "vertically", "horizontally", "laterally", "lower" and "underneath" describe relative orientations between different parts of the structure being described, and it is to be understood that the overall structure being described can actually be oriented in any way in three-dimensional space.

Figure 1:
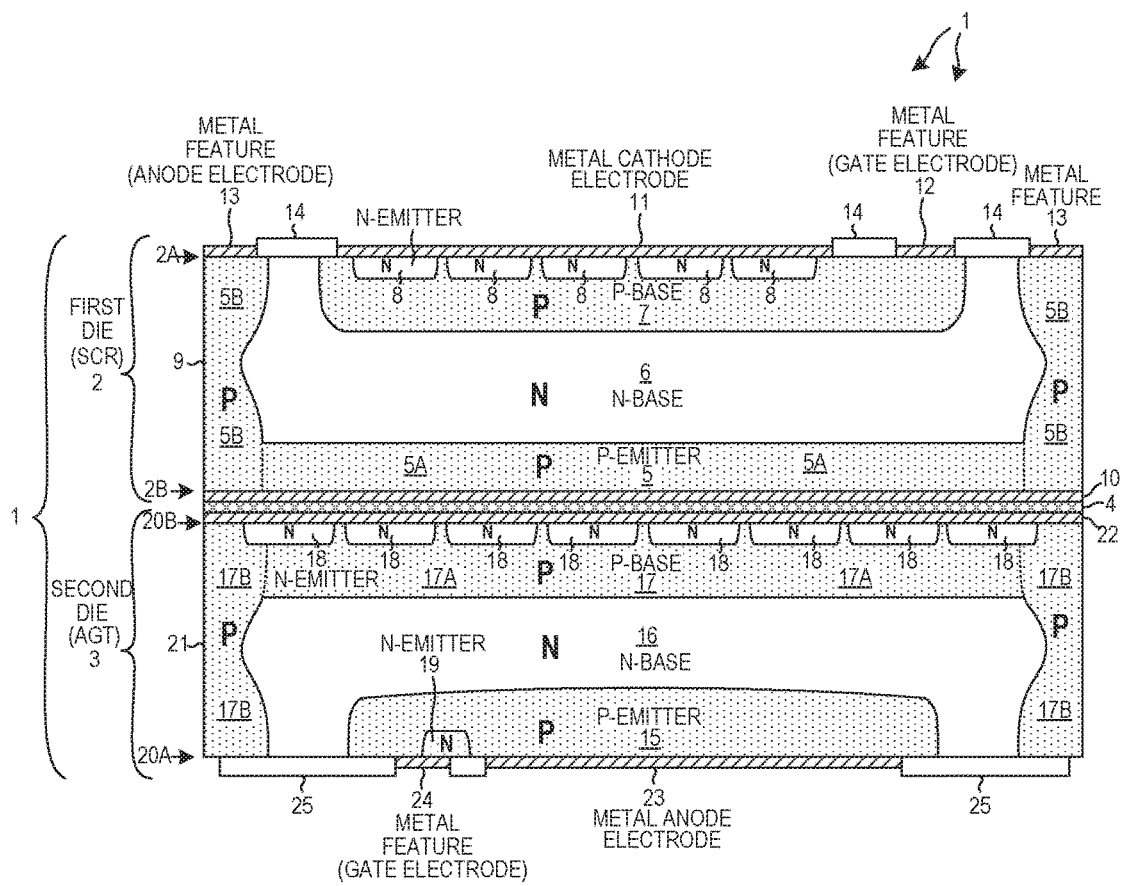
FIG. 1 is a cross-sectional side view of a stacked power semiconductor device die assembly in accordance with one novel aspect.

FIG. 1 is a cross-sectional side view diagram of a power semiconductor device assembly 1. Assembly 1 includes a first power semiconductor device die 2 and a second power semiconductor device die 3. The backside of the first die 2 is bonded to the backside of the second die 3 by a conductive metal layer 4. In one example, conductive metal layer 4 is a layer of sintered silver. The first and second dice 2 and 3 are shown in simplified fashion. Each of the first and second dice 2 and 3 may, for example, include additional peripheral guard rings (not shown) and a metal field plate (not shown) as is known in the power semiconductor device arts.

The first die 2 is a thyristor die (also called a SCR or "Silicon Controlled Rectifier"). The first die 2 has a P type semiconductor region 5, an N type semiconductor region 6, a P type semiconductor region 7, and an N type semiconductor region 8. The N type semiconductor region 8 is referred to as the N-emitter region. The P type semiconductor region 7 is referred to as the P-base region. The P type semiconductor region 5 comprises a planar P type layer portion 5A that extends across the entire backside of the die as well as a peripheral edge separation P type diffusion region 5B. The two regions 5A and 5B merge together to form the larger P type semiconductor region 5. Region 5A is also referred to as the P-emitter region. The peripheral edge separation diffusion region 5B is an amount of P type semiconductor material that extends all the way from a first substantially planar semiconductor surface 2A of the die to a second substantially planar surface 2B of the die along a side edge 9 of the die. No part of any side edge of the first die 2 is N type semiconductor material. At least a part of the P type semiconductor region 5 is doped with aluminum. The first die 2 has a reverse breakdown voltage in excess of 3000 volts. A metal anode electrode 10 makes contact with the bottom surface of the P-emitter region 5. It is to this metal anode electrode 10 that the conductive layer 4 bonds. At the top of the die 2, a metal feature 11 makes contact with the N type region 8. Region 8 is also referred to as the N-emitter region. Metal feature 11 is the metal cathode electrode of the device. A metal feature 12 is disposed on the top semiconductor surface 2A and makes contact the P type P-base region 7. This metal feature 12 is the metal gate electrode (a control electrode) of the device. A metal feature 13 is disposed on the top surface of the P type peripheral edge separation diffusion region 5B. This metal feature 13 is the metal anode electrode of the device. Metal feature 13, when the die is considered from the top-down perspective, appears as a four-sided peripheral ring of metal that extends along the four peripheral edges of the die 2. This ring of metal is not entirely covered with passivation, but rather is at least in part exposed from the top of die 2 so that an electrode connection can be made down to the ring by one or more bond wires. Reference numeral 14 identifies areas of passivation that are disposed on the top semiconductor surface 2A.

The second die 3 is an Anode-Gated Thyristor (an AGT) die. Second die 3 has a P type semiconductor region 15, an N type semiconductor region 16, a P type semiconductor region 17, and an N type semiconductor region 18. N type region 19 is also referred to as the N-emitter region. The P type semiconductor region 15 is also referred to as the P-emitter region. The N type semiconductor region 18 is also referred to as the N-emitter region. The P type semiconductor region 17A is also referred to as the P-base region. P type semiconductor region 17 comprises a planar P type layer portion 17A that extends across the entire backside of the die as well as a peripheral edge separation P type diffusion region 17B. The two regions 17A and 17B merge together to form the larger P type semiconductor region 17. The peripheral edge separation diffusion region 17B is an amount of P type semiconductor material that extends all the way from a first substantially planar semiconductor surface 20A of the die to a second substantially planar surface 20B of the die along a side edge 21 of the die. At least a part of the P type semiconductor region 17 is doped with aluminum. A metal cathode electrode 22 makes contact with the N-emitter region 18. It is to this metal cathode electrode 22 that the conductive layer 4 bonds. A metal feature 23 makes contact with the P type P-emitter region 15. This metal feature 23 is the metal anode electrode of the device. A metal feature 24 is disposed on semiconductor surface 20A and makes contact to the N type region 19 and to the P type P-emitter region 15. This metal feature 24 is the metal gate electrode (a control electrode) of the device of the second die. Reference numeral 25 identifies an area of passivation that is disposed on the semiconductor surface 20A.

Figure 2:
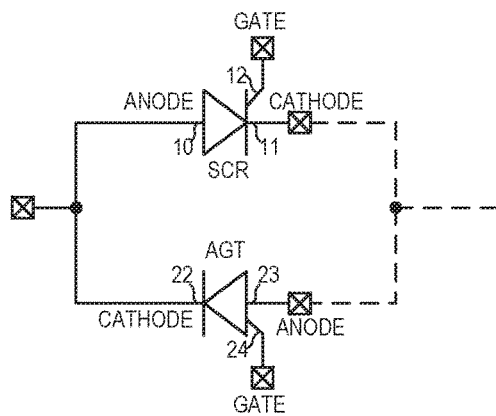
FIG. 2 is a circuit diagram of the assembly of FIG. 1.

FIG. 2 is a circuit diagram of the circuit of FIG. 1. The metal anode electrode 10 of the first die 2 is mounted to, and is electrically coupled to, the metal cathode electrode 22 of the second die 3. The metal anode electrode 10 of the first die 2 is mounted to the metal cathode electrode 22 of the second die 3 by sintered silver metal layer 4. Metal feature 12 provides a gate electrode bond pad for the first die 2. Metal feature 11 provides a cathode electrode bond pad for the first die 2. Metal feature 13 provides an anode electrode bond pad for first die 2, and simultaneously provides a bond pad for the cathode electrode of the second die 3 due to the fact that the P emitter region 5 of the first die is mounted to the N-emitter region 18 of the second die. Metal feature 23 provides the anode electrode bond pad of the second die 3. Metal feature 24 provides the gate electrode bond pad of the second die 3.

Figure 3:
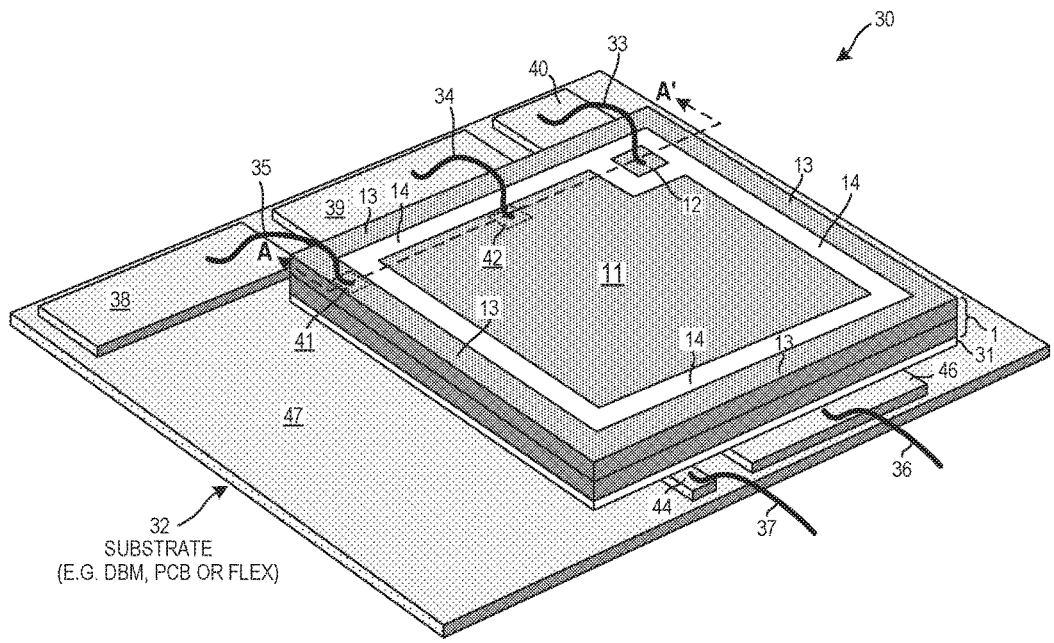
FIG. 3 is a perspective diagram of a die stack assembly involving a first power semiconductor device die, a second power semiconductor device die, and a die-sized interface member, where the die stack assembly is mounted to the top of a substrate.

FIG. 3 is a perspective view of an assembly 30. The assembly 30 includes the assembly 1 of FIG. 1, as well as a die-sized interface member 31, a substrate 32, and bond wires 33-37. Bond wire 35 physically connects at one end to a patterned metal feature 38 of the substrate 32. Substrate 32, which in one example is a Direct-Bonded Metal ("DBM") or a Direct-Bonded Copper ("DBC") or a Direct-Copper Bonded ("DCB") structure, includes an insulative body layer 47, and several patterned metal features 38, 39, 40, 44 and 46 disposed on the insulative body layer 47. Through this bond wire 35, an electrical connection is established from the patterned metal feature 38, through the bond wire 35, to a bond pad portion 41 of the ring metal feature 13, and then through the peripheral edge separation diffusion region 5B of the first die 2, and through the metal layers 10, 4, and 22, to the N type semiconductor region 18 of the second die 3. Metal layer 22 is an electrode of the second die 3. In addition, bond wire 34 couples patterned metal feature 39 of the substrate 32 to a bond pad portion 42 of the metal cathode electrode 11 of the first die 2. Bond wire 33 couples patterned metal feature 40 to metal feature 12 (gate electrode bond pad 12) of first die 2. Each of the bond pad portions 41, 42, and 12 on the top of the first die is at least one hundred microns wide by one hundred microns long so that there is enough square surface area of exposed metal provided for wirebonding. Bond pad portion 41 is preferably disposed less than one hundred microns from the side edge 9 of the first die 2. Metal gate electrode 24 on the bottom of assembly 1 is coupled through a metal portion 43 of the die-sized interface member 31 to a patterned metal feature 44 on the top of substrate 32. Metal anode electrode 23 on the bottom of assembly 1 is coupled through a metal portion 45 of die-sized interface member 31 to a patterned metal feature 46 on the top of substrate 32. Bond wire 37 couples the patterned metal feature 44 of the substrate 32 to another object such as, for example, a first bonding pad (not shown) of a first lead of a lead frame. Bond wire 36 couples the patterned metal feature 46 of the substrate 32 to another object such as, for example, a second bonding pad (not shown) of a second lead of the lead frame.

Figure 4:
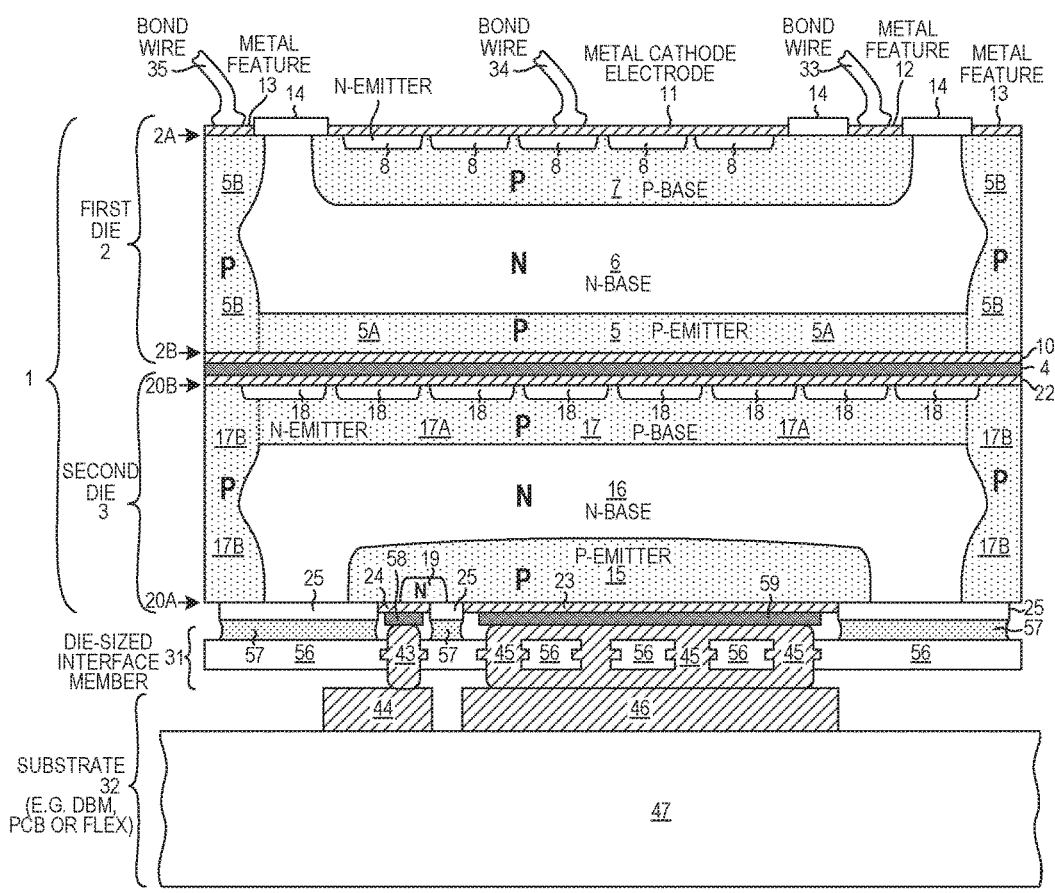
FIG. 4 is a cross-sectional diagram of the assembly of FIG. 3.

FIG. 4 is a cross-sectional diagram that shows the assembly 30 of FIG. 3 in more detail. The cross-sectional view of FIG. 4 is taken along sectional line A-A' of FIG. 3. Die-sized interface member 31 includes an insulative layer 56 as well as a number of metal portions. Although not illustrated this way in FIG. 4, insulative layer 56 may be a composite sandwich structure of multiple insulative layers and each metal portion may also be a composite sandwich structure of multiple metal layers. Each metal portion of the die-sized interface member 31 provides electrical contact from the top side of insulative layer 56, through the insulative layer 56, and to the bottom side of insulative layer 56. Two of the metal portions are identified in FIG. 4 by reference numerals 43 and 45. Passivation layer 25 on the downward facing surface of the second die 3 is substantially thicker than metal features 23 and 24. The metal portions 43 and 45 of the die-sized interface member 31 extend upward from the top surface of insulative layer 56 by enough so that the metal portion 43 makes physical and electrical contact with metal feature 24, and so that metal portion 45 makes physical and electrical contact with metal feature 23. Die-sized interface member 31 is fabricated so that the metal portions of the die-sized interface member 31 register with, and can make electrical contact with, proper corresponding metal features on the downward facing surface of the second die 3. The metal portions 43 and 45 of the die-sized interface member 31 also register with, and make electrical contact with, corresponding metal features on the top side of substrate 32. Reference numeral 57 identifies amounts of adhesive disposed between the die-sized interface member 31 and the bottom of the second die 3. Reference numeral 58 identifies an amount of sintered silver that bonds and electrically couples metal portion 43 of the die-sized interface member 31 to the corresponding metal feature 24 on the bottom of the second die 3. Reference numeral 59 identifies an amount of sintered silver that bonds and electrically couples metal portion 45 of the die-sized interface member 31 to the corresponding metal feature 23 on the bottom of the second die 3.

After the assembly structure of FIG. 3 has been fabricated, it is packaged and is thereby incorporated into a semiconductor device package. In one example, the assembly structure of FIG. 3 is wire bonded and/or attached as appropriate to a stamped metal lead frame (not shown). The assembly structure of FIG. 3 is then overmolded with a volume of an encapsulant in an injection molding process. The metal leads of the lead frame that extend from the volume of encapsulant are then trimmed and lead formed to make a standard leaded plastic semiconductor device package.

Figure 5:
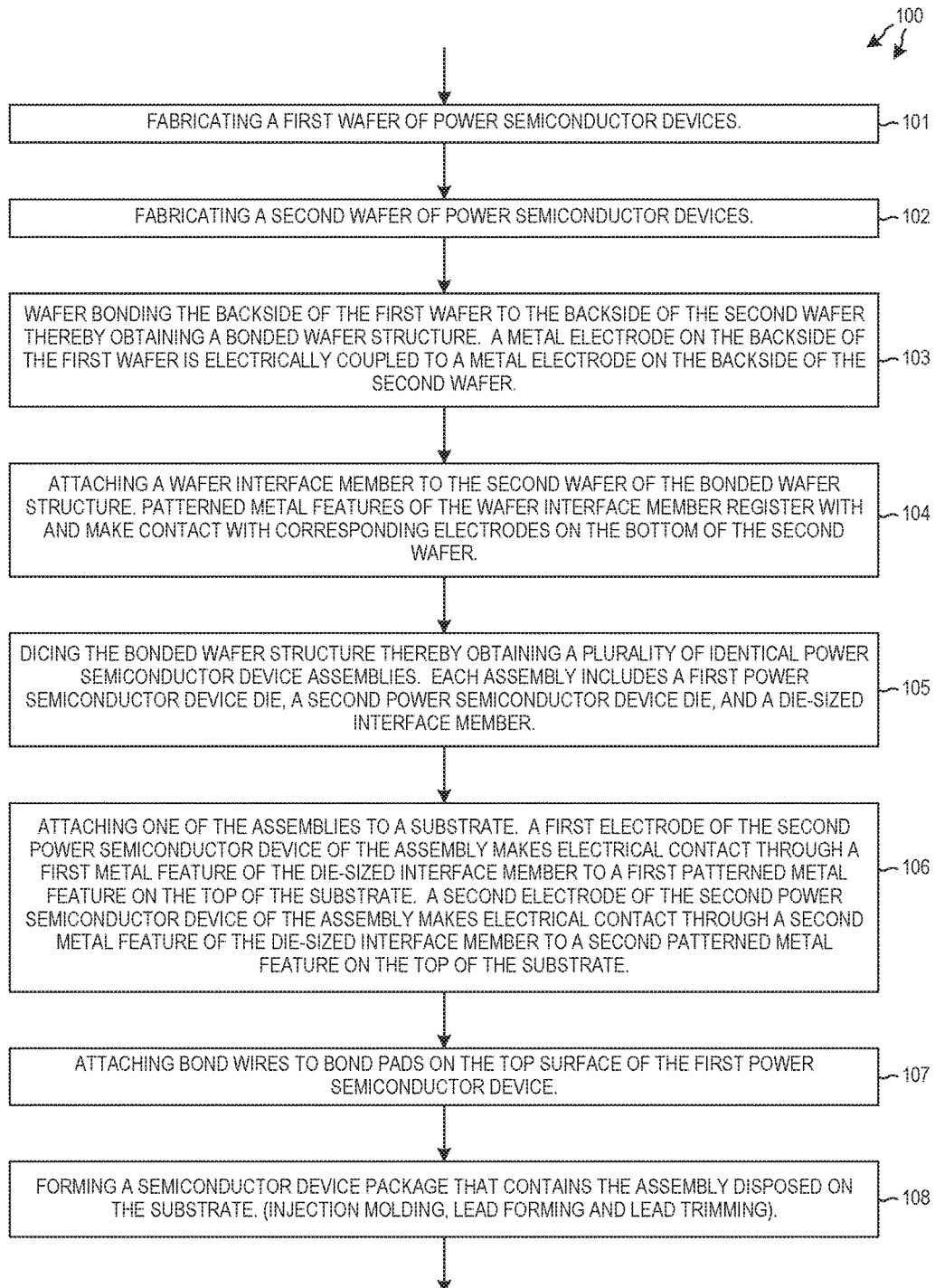
FIG. 5 is a flowchart of a method of fabricating a packaged power semiconductor device in accordance with another novel aspect.

FIG. 5 is a flowchart of a method 100 in accordance with one novel aspect. A first wafer of power semiconductor devices is fabricated (step 101). Each of what will be individual dice of the first wafer has a peripheral edge separation structure. A second wafer of power semiconductor devices is fabricated (step 102). The backside of the first wafer is wafer bonded (step 103) to the backside of the second wafer, thereby obtaining a bonded wafer structure. The backside of a wafer is the side of the wafer that does not have any gate electrodes. In one example, the wafer bonding is done by sandwiching a foil of sinterable material between the two wafers, and then under pressure heating the sandwich such that the silver of the sinter foil sinters, and in so bonds the two wafers together. A suitable sinter foil can be obtained from Alpha Sintered Metals, 95 Mason Run Road, Ridgway, Pa. 15853. With adequate pressure, the sintering temperature and duration of the sintering operation are reduced to the point that the semiconductor structures within the two wafers are not damaged in this high temperature step.

Next, a wafer-shaped interface member is attached (step 104) to the second wafer side of the bonded wafer structure. In one example, the wafer-shaped interface member is a flexible wafer-shaped interface member available from Mektec International Corporation, 1731 Technology Drive, Suite 840, San Jose, Calif. 95110. The flexible wafer-shaped interface member includes an insulative layer that has patterned metal portions. The insulative layer has holes through it such that each of the patterned metal portions of the wafer-shaped interface member provides an electrical connection from one side of the wafer-shaped interface member, through the insulative layer, and to the other side of the wafer-shaped interface member. The insulative layer of the wafer-shaped interface member may, for example, be a flexible layer of insulative material such as mylar or polyimide. In another example, the insulative layer is a rigid layer of insulative material such as FR4 fiberglass and epoxy. Prior to attaching the wafer-shaped interface member to the bottom of the second wafer, regions of sintered or sinterable silver may be formed or otherwise placed on the metal features on the bottom side of the second wafer. An adhesive can be applied to selected parts of the bottom of the prepared second wafer. The wafer-shaped interface member is then placed onto the adhesive. The entire sandwich structure is then heated under appropriate pressure and temperature so that discrete amounts of sinterable silver form good electrical contacts between the metal features on the bottom of the second wafer and corresponding metal portions on top of the wafer-shaped interface member.

After attachment of the wafer-shaped interface member to the second wafer of the bonded wafer structure, the bonded wafer structure is diced (step 105) so that a plurality of identical power semiconductor device die assemblies is obtained. Each power semiconductor device die assembly includes a first power semiconductor device die, a second power semiconductor device die, and a die-sized interface member. The peripheral edge separation structure of the first die is electrically coupled to an electrode of the second die. Because the first power semiconductor device die, the second power semiconductor device die, and the die-sized interface member are all cut at the same time from the same bonded wafer structure, the periphery of the first die, the periphery of the second die, and the periphery of the die-sized interface member are all identical. The cross-section of the power semiconductor device die assembly is as shown in FIG. 4.

Next, bond wires are attached (step 106) to bond pads on the top surface of the power semiconductor device assembly. In one example, the bottom of the power semiconductor device assembly is mounted to the top of a substrate, and certain of the bond pads on the top of the power semiconductor device die assembly are wire bonded to patterned metal features on the top of the substrate as shown in FIG. 3. The bottom of the resulting structure is placed on a device support portion of a lead frame, and more wire bonding is performed to connect appropriate parts of the assembly and/or substrate to corresponding bonding pads of leads of the lead frame. After the wire bonding, a wire bond is left attached to a bond pad on the top surface of the die assembly such that an electrical connection exists from the bond wire, through the bond pad, through the peripheral edge separation structure of the first die, and to an electrode of the second die. Typically, several bond wires will be attached to the same four-sided ring-shaped metal feature 13. These several bond wires provide separate parallel current paths to/from the four-sided ring-shaped metal feature 13. Accordingly, the novel ring-shaped metal feature 13 may have a ring of bond pad areas for engaging multiple separate bond wires. After the assembly and the substrate have been mounted and wirebonded as appropriate to the leadframe, a semiconductor device package is formed (step 108) that contains the assembly. The forming of the semiconductor device package may, for example, include the step of injection molding an amount of molding compound over the assembly, then step of lead forming, and the step of lead trimming.

In a first example of the method of FIG. 5, the peripheral edge separation structure of the first wafer is formed by providing a first strip of aluminum on the top of the N-type wafer so that the strip extends along what will be the ultimate side edges of the device die. A second strip of aluminum is provided on the opposite side of the wafer, directly underneath the first strip. The two aluminum strips act as a diffusion sources. The aluminum strips are first converted into aluminum oxide by heating the first wafer in a nitrogen-oxygen atmosphere at a temperature of about 500 degrees Celsius, which is a temperature below the 660 degree Celsius melting point of aluminum. Once the aluminum has been oxidized, the first wafer is heated to a higher temperature of about 1250 degrees Celsius. Under this higher temperature condition, aluminum from the aluminum oxide strips diffuses into the first wafer, thereby forming a downward extending P type region that extends downward from the top semiconductor surface of the wafer, and thereby forming an upward extending P type region that extends upward from the bottom semiconductor surface of the wafer. The two diffusion fronts of aluminum meet, thereby forming a peripheral P type region that extends all the way from the top semiconductor surface of the wafer, through the wafer, and to the bottom semiconductor surface of the wafer. The entire backside of the first wafer is doped with boron to form a P type layer. In each device area of the wafer, this boron-doped P type layer merges with a P type peripheral edge separation diffusion region to form an overall P type anode region. This P type region separates the active area of the device in the center of what will be the die (after singulation) from what will be the side edges of the die (after singulation). The peripheral edge separation structure keeps the high electric fields of the reverse biased depletion region in the active area from reaching the side edges of the die. For additional information on peripheral edge separation structures and techniques suitable for use in making the first die 2, see: 1) U.S. patent application Ser. No. 14/948,156, entitled "Trench Separation Diffusion For High Voltage Device", filed Nov. 20, 2015, by Wisotzki et al.; 2) U.S. Pat. No. 7,442,630, entitled "Method For Fabricating Forward And Reverse Blocking Devices, filed Aug. 30, 2005, by Kelberlau et al.; and 3) U.S. Pat. No. 5,698,454, entitled "Method Of Making A Reverse Blocking IGBT", filed Jul. 31, 1995, by N. Zommer (the entire subject matter of each of these patent documents is incorporated by reference herein).

Figure 6:
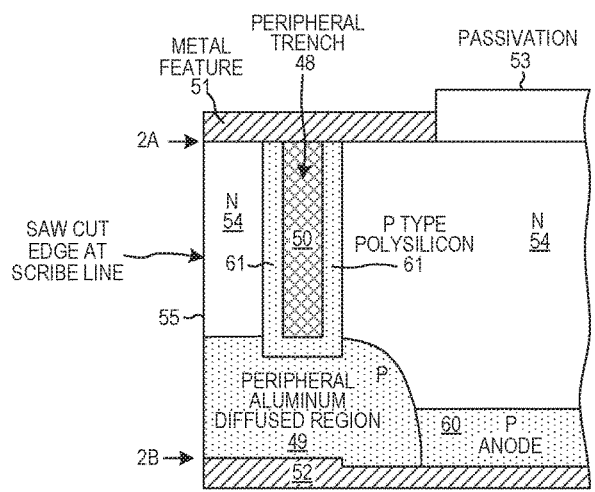
FIG. 6 is a cross-sectional diagram of a peripheral edge separation structure that may be employed in the structures of FIG. 1, FIG. 3 and FIG. 4.

In a second example of the method, the peripheral edge separation structure of the first wafer is the structure shown in cross-section in FIG. 6. As in the case of the peripheral edge separation structure of FIG. 1, a region of P type semiconductor material extends all the way from the top substantially planar semiconductor surface of the wafer to the bottom substantially planar semiconductor surface of the wafer. In the case of the peripheral edge separation structure of FIG. 6, this P type semiconductor material includes an amount of P type polysilicon 61 disposed on a sidewall of a peripheral trench 48, and also includes a region of P type semiconductor material 49 that extends upward from semiconductor surface 2B. After deposition of P type polysilicon 61 in the trench, the remainder of the trench is filled, for example with oxide 50. A peripheral four-sided ring-shaped metal feature 51 extends along the peripheral side edges of the die of FIG. 6 at surface 2A in the same way that the four-sided ring-shaped metal feature 13 extends along the peripheral side edges of the first die of FIG. 1. P type layer 60 of FIG. 6 corresponds to P type layer 5A of FIG. 1. Metal layer 52 of FIG. 6 corresponds to metal layer 10 of FIG. 1. Passivation layer 53 of FIG. 6 corresponds to passivation layer 14 of FIG. 1. N type region 54 of FIG. 6 corresponds to N type region 6 of FIG. 1. Side edge 55 of FIG. 6 corresponds to side edge 9 of FIG. 1. For additional information on the peripheral edge separation structure of FIG. 6, see: U.S. patent application Ser. No. 14/948,156, entitled "Trench Separation Diffusion For High Voltage Device", filed Nov. 20, 2015, by Wisotzki et al. (the entire subject matter of which is incorporated by reference herein).

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A method comprising:
   (a) wafer bonding a backside of a first wafer to a backside of a second wafer thereby obtaining a bonded wafer structure;
   (b) dicing the bonded wafer structure thereby obtaining a power semiconductor device die assembly, wherein the power semiconductor device die assembly comprises a first power semiconductor device die and a second power semiconductor device die, wherein the first power semiconductor device die comprises a peripheral edge separation structure that extends from a first substantially planar semiconductor surface of the first power semiconductor device die to a second substantially planar semiconductor surface of the first power semiconductor device die along a side edge of the first power semiconductor device die, wherein the second power semiconductor device die comprises a peripheral edge separation structure that extends from a first substantially planar semiconductor surface of the second power semiconductor device die to a second substantially planar semiconductor surface of the second power semiconductor device die along a side edge of the second power semiconductor device die;
   (c) forming an anode of the power semiconductor device die assembly by providing a metal feature that covers and makes electrical contact with the peripheral edge separation structure at the first substantially planar semiconductor surface of the first power semiconductor device die, wherein the metal feature is electrically coupled within the assembly through the peripheral edge separation structure of the first power semiconductor device die to the peripheral edge separation structure of the second power semiconductor device die; and
   forming a cathode of the power semiconductor device die assembly by providing a further metal feature that covers and makes electrical contact with a region of the first substantially planar semiconductor surface,
   wherein the second power semiconductor device die forms an anode gated thyristor, wherein a metal contact structure is not formed on the peripheral edge separation structure of the second power semiconductor device die.

2. The method of claim 1, further comprising:
   (c) attaching a bond wire to a bond pad, wherein the bond pad is disposed on a surface area of the peripheral edge separation structure of the first power semiconductor device die.

3. The method of claim 1, further comprising:
   (c) attaching a wafer interface member to a topside of the second wafer prior to the dicing of (b) such that when the dicing of (b) occurs the wafer interface member is diced along with the first and second wafers, wherein the power semiconductor device die assembly comprises the first power semiconductor device die, the second power semiconductor device die, and a die-sized interface member cut from the wafer interface member, wherein the die-sized interface member comprises a first metal feature and a second metal feature, wherein the first metal feature is in electrical contact with a first metal electrode of the second power semiconductor device die, and wherein the second metal feature is in electrical contact with a second metal electrode of the second power semiconductor device die.

4. The method of claim 1, wherein the peripheral edge separation structure of the first power semiconductor device die is a region of P type semiconductor material, and wherein no part of the side edge of the first power semiconductor device die is N type semiconductor material.

5. The method of claim 1, wherein the first power semiconductor device die has a control electrode disposed on the first substantially planar semiconductor surface of the first power semiconductor device die, and wherein the second power semiconductor device die has a control electrode disposed on the first substantially planar semiconductor surface of the second power semiconductor device die.

6. The method of claim 5, wherein the peripheral edge separation structure of the first die is a region of P type semiconductor material, and wherein no part of the side edge of the first die is N type semiconductor material.

7. The method of claim 5, wherein the first die has a control electrode disposed on the first substantially planar semiconductor surface of the first die, and wherein the second die has a control electrode disposed on the first substantially planar semiconductor surface of the second die.

8. The method of claim 1, wherein the first power semiconductor device die further comprises a metal layer disposed on the second substantially planar semiconductor surface of the first power semiconductor device die, wherein the second power semiconductor device die further comprises a metal layer disposed on the second substantially planar semiconductor surface of the second power semiconductor device die, and wherein the metal layer of the first power semiconductor device die is bonded to the metal layer of the second power semiconductor device die.

9. The method of claim 8, wherein a layer comprising silver bonds the metal layer disposed on the second substantially planar semiconductor surface of the first power semiconductor device die to the metal layer disposed on the second substantially planar semiconductor surface of the second power semiconductor device die.

10. The method of claim 9, wherein the wafer bonding of (a) involves sintering the layer comprising silver.

11. A method comprising:
    wafer bonding a backside of a first wafer to a backside of a second wafer thereby obtaining a bonded wafer structure;
    dicing the bonded wafer structure to obtain a die assembly, wherein the die assembly comprises a first die and a second die, wherein the first die comprises a peripheral edge separation structure that extends from a first substantially planar semiconductor surface of the first die to a second substantially planar semiconductor surface of the first die along a side edge of the first die, wherein the second die comprises a peripheral edge separation structure that extends from a first substantially planar semiconductor surface of the second die to a second substantially planar semiconductor surface of the second die along a side edge of the second die, wherein the peripheral edge separation structure of the first die is a region of P type semiconductor material;

forming an anode of the power semiconductor device die assembly by providing an amount of metal that covers and makes electrical contact with the peripheral edge separation structure at the first substantially planar semiconductor surface of the first die, and wherein the amount of metal is electrically coupled within the assembly through the peripheral edge separation structure of the first die to the peripheral edge separation structure of the second die; and forming a cathode of the power semiconductor device die assembly by providing a further metal feature that covers and makes electrical contact with a region of the first substantially planar semiconductor surface, wherein the second die forms an anode gated thyristor, wherein a metal contact structure is not formed on the peripheral edge separation structure of the second die.

12. The method of claim 11, further comprising:
attaching a bond wire to a bond pad, wherein the bond pad is disposed on a surface area of the peripheral edge separation structure of the first die.

13. The method of claim 11, further comprising:
attaching a wafer interface member to a topside of the second wafer prior to the dicing such that the wafer interface member is diced along with the first and second wafers, wherein the die assembly comprises the first die, the second die, and a die-sized interface member cut from the wafer interface member, wherein the die-sized interface member comprises a first metal feature and a second metal feature, wherein the first metal feature is in electrical contact with a first metal electrode of the second die, and wherein the second metal feature is in electrical contact with a second metal electrode of the second die.

14. The method of claim 11, wherein the wafer bonding involves sintering a layer comprising silver, and wherein the layer comprising silver is disposed between the second substantially planar semiconductor surface of the first die and the second substantially planar semiconductor surface of the second die.

15. The method of claim 11, wherein the first die further comprises a metal layer disposed on the second substantially planar semiconductor surface of the first die, wherein the second die further comprises a metal layer disposed on the second substantially planar semiconductor surface of the second die, and wherein the metal layer of the first die is bonded to the metal layer of the second die.

16. The method of claim 15, further comprising:
a layer comprising silver to bond the metal layer disposed on the second substantially planar semiconductor surface of the first die to the metal layer disposed on the second substantially planar semiconductor surface of the second die.

17. A method comprising:
(a) forming a power semiconductor device die assembly by dicing a bonded wafer structure having two wafers bonded together, wherein the power semiconductor device die assembly building comprises a first die and a second die, wherein the first die comprises a peripheral edge separation structure that extends from a first surface of the first die to a second surface of the first die along a side edge of the first die, wherein the second die comprises a peripheral edge separation structure that extends from a first surface of the second die to a second surface of the second die along a side edge of the second die, wherein an anode of the power semiconductor device die assembly is formed by a metal feature that covers and makes electrical contact with the peripheral edge separation structure at the first surface of the first die, and wherein the metal feature is electronically coupled within the assembly through the peripheral edge separation structure of the first die to the peripheral edge separation structure of the second die; and forming a cathode of the power semiconductor device die assembly by providing a further metal feature that covers and makes electrical contact with a region of the first substantially planar semiconductor surface, wherein the second die forms an anode gated thyristor, wherein a metal contact structure is not formed on the peripheral edge separation structure of the second die.

18. The method of claim 17, wherein the first die has a control electrode disposed on the first surface of the first due, and wherein the second die has a control electrode disposed on the first surface of the second die.

* * * * *